US008855097B2

(12) United States Patent
Neumann

(10) Patent No.: US 8,855,097 B2
(45) Date of Patent: Oct. 7, 2014

(54) METHOD USING A BLANKING SIGNAL TO REDUCE THE LEAKAGE TRANSMITTER-RECEIVER

(75) Inventor: Markus Neumann, Nuremberg (DE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 132 days.

(21) Appl. No.: 13/703,539

(22) PCT Filed: Jun. 30, 2010

(86) PCT No.: PCT/EP2010/003858
§ 371 (c)(1),
(2), (4) Date: Jan. 8, 2013

(87) PCT Pub. No.: WO2012/000524
PCT Pub. Date: Jan. 5, 2012

(65) Prior Publication Data
US 2013/0107870 A1 May 2, 2013

(51) Int. Cl.
*H04W 88/06* (2009.01)
*H04B 1/52* (2006.01)
*H04B 1/38* (2006.01)
*H03G 3/30* (2006.01)

(52) U.S. Cl.
CPC .............. *H04W 88/06* (2013.01); *H04B 1/525* (2013.01); *H04B 1/3805* (2013.01); *H03G 3/3078* (2013.01)
USPC ................ 370/347; 370/334; 455/88; 455/82

(58) Field of Classification Search
CPC ............................ H04W 88/06; H04B 1/3805
USPC ................. 370/347, 334; 455/88, 82
See application file for complete search history.

(56) References Cited

U.S. PATENT DOCUMENTS

| 5,301,368 A | 4/1994 | Hirata |
| 5,521,926 A * | 5/1996 | Ayerst et al. .................. 370/347 |
| 5,889,821 A | 3/1999 | Arnstein et al. |
| 6,107,960 A | 8/2000 | Krasner |
| 6,442,375 B1 | 8/2002 | Parmentier |

(Continued)

FOREIGN PATENT DOCUMENTS

| EP | 2045615 A1 | 4/2009 |
| GB | 2113047 A | 7/1983 |
| WO | 0106669 A1 | 1/2001 |
| WO | 2004075423 A2 | 9/2004 |

*Primary Examiner* — Rasheed Gidado
(74) *Attorney, Agent, or Firm* — Coats & Bennett, PLLC

(57) ABSTRACT

It is described a communication end device comprising (a) a radio transceiver comprising a receiver for receiving radio signals from a transmitting network entity of a cellular telecommunication network and a transmitter (110, 120, 130) for transmitting radio signals to a receiving network entity of the cellular telecommunication network, (b) a further receiver (140) for receiving a further radio signal, and (c) a control circuit (150, 162, 164), which is coupled to the radio transceiver and to the further receiver (140). The control circuit (150, 162, 164) is configured for generating a control signal for controlling the operation of the further receiver (140). Thereby, the control signal is based on a synchronization signal being related to a time dependent transmission scheme of the transmitter (110, 120, 130) and on an information about the current operational state of the radio transceiver. It is further described a method for controlling the operation of such a communication end device (100) and a program element and a computer-readable medium having stored such a program element, which is adapted for controlling and/or for carrying out this operation control method.

21 Claims, 2 Drawing Sheets

(56) References Cited

U.S. PATENT DOCUMENTS

| | | |
|---|---|---|
| 6,448,925 B1 | 9/2002 | Shridhara |
| 6,591,086 B1 | 7/2003 | Pleasant |
| 6,993,296 B2 * | 1/2006 | Leyh et al. .................. 455/78 |
| 8,583,057 B2 * | 11/2013 | Tu et al. ..................... 455/82 |
| 8,755,747 B2 * | 6/2014 | Robinson et al. ............ 455/41.2 |
| 8,761,032 B2 * | 6/2014 | Lin et al. ..................... 370/252 |
| 2004/0166840 A1 * | 8/2004 | Kawamura .................. 455/419 |
| 2005/0097595 A1 * | 5/2005 | Lipsanen et al. ............ 725/25 |
| 2007/0064835 A1 | 3/2007 | Auranen |

* cited by examiner

METHOD USING A BLANKING SIGNAL TO REDUCE THE LEAKAGE TRANSMITTER-RECEIVER

FIELD OF THE INVENTION

The present invention relates to the technical field of mobile communication end devices, which comprise a transmitter and at least two receivers, wherein the two receivers are capable of receiving two different types of radio signals. Specifically, the present invention relates to a mobile communication end device comprising a transmitter and at least two receivers and to a method for operating such a mobile communication end device, wherein self interference between the transmitter and at least one of the two receivers can be minimized. Further the present invention relates to a program element and to a computer-readable medium with such a program element, which is adapted for controlling and/or for carrying out the described method.

BACKGROUND OF THE INVENTION

The use of portable personal communication devices, such as cellular phones, Personal Digital Assistant (PDA), a notebook computer and/or any other movable communication devices being configured to connect to a telecommunication network in a wireless manner, has increased dramatically in recent years. Additionally, the use of portable navigational devices, such as Satellite Positioning System (SPS) receivers, has increased as these devices have become more widely available. Further technological developments have allowed the combination of an SPS receiver (e.g. a Global Positioning System (GPS) receiver) and a radio communication device in an integrated unit, such as a combination of a GPS receiver and cellular phone unit. Such combined communication end devices have many applications such as personal security, emergency response, vehicle tracking, and inventory control.

However, such combined communication end devices may also exhibit certain shortcomings such as increased power consumption and a reduced performance. One marked disadvantage inherent in many combined SPS receiver and radio communication device is the decreased performance of the SPS receiver in particular when a radio transmitter of the radio communication device is active. A common reason for such a performance reduction is self interference between the radio transmitter and the SPS receiver. Although the radio transmitter of the radio communication device and the SPS (radio) receiver typically operate in completely different frequency bands, the described self interference is often troublesome because of at least some of the following reasons: (A) The spatial distance between the radio transmitter and the SPS receiver is small. (B) The radio transmitter transmits a comparatively strong radio signal, which has to reach a base station of a cellular telecommunication network. (C) The SPS receiver is typically very sensitive, because the SPS signal level on the earth's surface is typically very small.

U.S. Pat. No. 6,107,960 discloses a method and an apparatus for reducing self or cross interference in a combined satellite positioning system receiver and communication transceiver device. A control signal is transmitted from the communication transceiver to the satellite positioning system receiver when the communication transceiver transmits data at a high power level over a communication link. The control signal causes satellite positioning system signals from satellites to be blocked from the receiving circuits of the satellite positioning system receiver, or to be disregarded by the processing circuits of the satellite positioning system receiver.

US 2007/0064835 A1 discloses measures for reducing a self interference within a communication end device comprising a radio transmitter and a radio receiver. The measures include freezing an automatic gain control loop of the radio receiver, freezing a synchronization loop, discarding channel estimation data and/or blanking received information. Certain criteria, such as a transmission power and a transmission mode may also be used to determine whether and how many measures are to be used.

U.S. Pat. No. 5,301,368 discloses a system for controlling the operation of a radio telephone and a GPS receiver in a coordinated manner. If the level of a received GPS signal is below a predefined threshold level, a control unit determines whether the radio telephone is in an ON-CALL mode (i.e. the radio telephone is transmitting) or in an OFF-CALL mode (i.e. the radio telephone is not transmitting). (A) If the radio telephone is in the OFF-CALL mode, the GPS receiver is switched on. When receiving GPS data an "Automated Gain Control" is activated. Further circuit components ensure that during GPS reception no jamming signals are transmitted by the radio transmitter of the radio telephone. However, if there is no GPS signal being received by the GPS receiver, the radio telephone is allowed to transmit radio control signals. (B) If the radio telephone is in the ON-CALL mode the GPS receiver is disabled or blanked.

The known self interference countermeasure by disabling a GPS receiver during an active radio transmitter has the disadvantage that with an increasing activity of the radio transmitter, the GPS receiver will be increasingly blanked. In particular as Long Term Evolution (LTE) technology typically implies a continuous transmission of a cellular transceiver, the known blanking solution may not work since the GPS receiver will be disabled (almost) all the time.

There may be a need for providing a mechanism, which allows (a) for an efficient reduction of self interference between a transmitting portion of a radio transceiver and a further radio receiver of a combined communication end device and (b) for a reliable reception of radio signals by the radio receiver even if the transmitting portion of the radio transceiver is mostly active.

SUMMARY OF THE INVENTION

This need may be met by the subject matter according to the independent claims. Advantageous embodiments of the present invention are described by the dependent claims.

According to a first aspect of the invention there is provided a communication end device which comprises (a) a radio transceiver comprising a receiver for receiving radio signals from a transmitting network entity of a cellular telecommunication network and a transmitter for transmitting radio signals to a receiving network entity of the cellular telecommunication network, (b) a further receiver for receiving a further radio signal, and (c) a control circuit, which is coupled to the radio transceiver and to the further receiver. The control unit is configured for generating a control signal for controlling the operation of the further receiver, wherein the control signal is based on (c1) a synchronization signal being related to a time dependent transmission scheme of the transmitter and on (c2) an information about the current operational state of the radio transceiver.

The described communication end device is based on the idea that when controlling the operation of the further receiver based on both (a) a synchronization signal being related to a predefined time pattern of a time dependent transmission scheme of the transmitter of the radio transceiver and (b) the current operational state of the radio transceiver a highly adaptive operational control of the further receiver can be realized. This means that the operation of the further receiver is not exclusively dependent on solely the pulsing or time structure being used for the time dependent transmission scheme of the transmitter. The operation of the further receiver rather depends on a combination between (a) information about the pulsing or time structure being associated with the time dependent transmission scheme of the transmitter and (b) information about the actual operational state of the radio transceiver and in particular the transmitter of the radio transceiver. Thereby, it can for instance be ensured that depending on the operational state of the transceiver a disabling or a blanking of the further receiver will only be performed if such a disabling or a blanking is really necessary in order to avoid strong self interference. Due to the dependency of the control of the further receiver a disabling or a blanking can exactly be synchronized with the time structure of the time dependent transmission scheme of the transmitter.

In other words, a combination of a first control signal that is synchronized with the actual time structure of the time dependent transmission scheme of the transmitter and a second control signal that is controlled according to the actual operational states of the communication end device for instance by a system controller of the communication end device may be combined to the described control signal. Based on this (combined) control signal it may be prevented to perform a blanking or disabling of the further receiver at operation states where such a blanking or disabling would cause a disprofit. This may mean that the described communication end device may allow for performing a disabling or blanking of its further (radio) receiver only when it is really necessary and when it is proven by the further receiver.

The described control of the operation of the further receiver works on cellular radio transmitters for plenty of bands and multiple of standards that incorporate cellular multimode. This may mean that the described operation control can also be employed in case of an inter-standard and/or an inter-band handover of the described communication end device.

The receiver might be capable of receiving a first type of radio signal and the further receiver might be capable of receiving a second type of radio signal. Thereby, the first and the second type of radio signals might be different or might be the same. For instance the first type of radio signal might be a comparatively strong downlink radio signal transmitted by an access node such as a base station of a cellular radio telecommunication network. The second type of radio signal might be a comparatively weak radio signal from a Satellite Positioning System (SPS) satellite such as a Global Positioning System (GPS) satellite or from a Radio Frequency Identification device.

It is pointed out that the "information about the current operational state" may comprise information about the transceiver, which information goes beyond information about the simple pulsing or time structure being used for the time dependent transmission scheme of the transmitter.

According to an embodiment of the present invention the control signal comprises an enable signal and/or a disable signal for the further receiver. This may provide the advantage that the operation of the further receiver can be controlled in a very simple but effective manner. Thereby, a blanking or a disabling of the operation of the further receiver can be realized in particular at times, when there is expected a strong self interference between the transmitter and the further receiver.

Generally speaking, the further receiver may receive information from the cellular transceiver regarding its actual operating state. Depending on a combination of this state information and the time pattern of the time dependent transmission scheme being used by the transmitter, the further receiver decides to enable/disable a reception of the further radio signal.

It is mentioned that a disabling or a blanking of the operation the further receiver may be accomplished basically with two measures, which could be applied individually or in combination. A first measure is a disabling of a receiving input stage of the further receiver. Typically, the receiving input stage handles only RF signals, which are directly provided by an antenna, which is associated with the further receiver. The second measure is a disabling of an RF signal processing portion of the further receiver. The processing portion, which is typically located directly downstream with respect to the receiving input stage, may comprise for instance an automatic gain control mechanism, which can be prevented from being disturbed by a strong RF signal caused by unwanted self interference.

According to an embodiment of the present invention the time dependent transmission scheme of the transmitter is a Time Division Multiple Access (TDMA) transmission scheme, a time varying coding scheme being used by the transmitter and/or a time varying usage of different carrier frequencies.

If the synchronization signal is related to the time structure of a TDMA radio transmission scheme, the radio transmission of the transmitter may occur in bursts. This means that as a function of time the transmitter is either active, i.e. a radio signal is transmitted, or passive, i.e. there is no radio signal transmission. Due to the dependency of the control of the further receiver a disabling or a blanking can exactly be synchronized with the transmission burst timing of the TDMA mode of the transmitter. The exact time structure of the TDMA mode of the transmitter may be controlled by the cellular telecommunication network or by the described communication end device.

If the synchronization signal is related to a time varying coding scheme being used by the transmitter the transmitter may be permanently active, however the amount of interference between the transmitter and the further receiver may vary in accordance with a predetermined time structure of the time dependent transmission scheme of the transmitter. Thereby, the time dependent transmission scheme may be for instance a time dependent modulation and/or coding scheme of a digital bit coding procedure that changes from a coding block or resource block to a subsequent coding block or resource block within a frame or transmission time interval (TTI) of a radio transmission.

If the synchronization signal is related to a time varying usage of different carrier frequencies the synchronization signal might be in particular used for synchronizing certain transmission frequencies of the transmitter that may cause a significant self interference between the transmitter and the further receiver. This may mean that a disabling or a blanking of the further receiver can be synchronized with a frequency change or hopping scheme of the transmitter. This might be in particular advantageous for all radio telecommunication systems, where bursts or resource blocks may be transmitted on different (carrier) frequencies. Such a system is for instance a LTE system or any other radio telecommunication system, which allows its transmitters to change (carrier) frequencies during transmission or perform a frequency hopping.

Descriptively speaking, the synchronization signal, which is related to a time varying usage of different carrier frequencies, might indicate time points or time periods, when (a) the actual transmission frequency of the transmitter comes close to the reception frequency of the further receiver and/or when (b) the transmission is carried out on frequencies, whose harmonics may cause significant interference in the further receiver. In case of a LTE transmitter and a GPS further receiver a self interference might occur for instance if for uplink radio transmissions the LTE transmitter uses the LTE Band 13 (777 MHz-787 MHz) and the further receiver would like to receive GPS signals at the so called L1 frequency (1575.42 MHz).

Therefore, the information about the current operational state of the radio transceiver may comprise information about a number or fraction of time slots or resource blocks or coding blocks within a time frame or transmission time interval of the time dependent transmission scheme, in which time slots or resource blocks or coding blocks the transmitter is active and/or expected to cause interference with the further receiver.

Particularly, according to a further embodiment of the present invention (a) the time dependent transmission scheme of the transmitter is a TDMA transmission scheme and (b) the information about the current operational state of the radio transceiver comprises information about a number of active time slots within a time frame of the TDMA transmission scheme, which active time slots are currently used by the radio transceiver for transmitting the radio signals. This may provide the advantage that the further receiver can be kept active during time slots, during which the transmitter of the radio transceiver is generally active for a discontinuous transmission but which are not actually used for transmitting radio signals.

In the case of a time varying coding scheme and/or time varying frequency usage, the information about the current operational state may comprise information about a number of time slots, resource blocks or coding blocks within a time frame or transmission time interval which are likely or expected to generate self-interference, e.g. time slots, resource blocks or coding blocks in which the modulation order is above a certain threshold in the case of a time-varying coding scheme or in which the used carrier frequency or at least one of its harmonics is close to the reception frequency of the further receiver.

In any case, the information about the current operational state may comprise an interference ratio indicator which indicates an amount of the time, e.g. based on a number of time slots, resource blocks or coding blocks as described above, in which self interference is present or likely or the ratio of this amount of time to the total length of a transmission time interval (TTI) or frame.

According to a further embodiment of the present invention the information about the current operational state of the radio transceiver comprises information about a selected transmission power of the transmitter of the radio transceiver. This may provide the advantage that a disabling or a blanking of the further receiver may be limited to those operational conditions, wherein there is expected a strong self interference between the transmitter of the receiver and the further receiver. Typically a strong self interference will occur if the transmitter is operated with a high selected transmission power.

In this respect one can take into account that there might occur an operational condition wherein despite of an active radio transmission it may not always be necessary to perform a disabling or blanking of the further receiver. Such an operational condition might be for instance an uplink transmission of very weak radio signals, which are supposed to be received by a very close base station such as a macro base station or a home base station (e.g. a pico access point or a femto access point).

The selected transmission power of the transmitter can be derived for instance by the control circuit and/or by any other control unit, which controls the operation of the transmitter. Further, the selected transmission power could also be sensed by an appropriate power detector, which preferably is located within or at the described communication end device. The power sensor may be for instance a power detector inside a power amplifier of the transmit path of the (cellular) radio transceiver. The power sensor may also be a power detector located within the receive path of the further receiver. Thereby, a feedback loop for controlling the operation of the communication end device may be established.

According to a further embodiment of the present invention the information about the current operational state of the radio transceiver comprises an activity information about the transmitter of the radio transceiver. The activity information may be indicative for instance for an idle mode, a call mode, a sleep mode etc.

According to a further embodiment of the present invention the information about the current operational state of the radio transceiver is generated by using a logical function, wherein at least two operational state parameters of the radio transceiver are used as inputs for the logical function. This may provide the advantage that only one single control signal may be used for describing a complex operational state of the radio transceiver. Specifically, a disabling or a blanking of the further receiver may be omitted or avoided, if at least one out of several operational conditions is present, wherein the presence of each one of these operational conditions might allow for a reliable reception of further radio signals by the further receiver.

The logical function may comprise for instance at least one OR-function, at least one AND-function or any combination between at least one OR-function and at least one AND-function. Also a fuzzy logic and/or a linear combination of probabilities each being associated with the presence and/or a parameter value of an operational state may be used in order to realize the described logical function.

According to a further embodiment of the present invention the control signal is generated further based on a reported receiver parameter of the further receiver. This may provide the advantage that the control of the further receiver may be even more specific for the actual operational condition of the whole communication end device.

In this respect it has to be understood that if the reception of the further radio signal is currently very reliable and/or stable, a comparatively strong self interference may be accepted without disturbing the further radio signal reception. Accordingly, if the radio reception of the further radio signal is not very stable only a very small or even no self interference may be allowed.

The reported receiver parameter may be for instance a Signal to Noise (S/N) ratio or a Signal to Interference Ratio (SIR). If these ratios are large, there might be allowed a comparatively large self interference within the described communication end device.

Further, the reported receiver parameter may be a Received Signal Strength Indicator (RSSI) or a Bit Error Rate (BER). Thereby, when there is a large RSSI there may be allowed a comparatively large self interference. When there is a large BER, the self interference should be kept very small in order to allow for a stable reception of further radio signals.

According to a further embodiment of the present invention the reported receiver parameter is indicative for a power level being received by the further receiver. This may provide the advantage that a feedback loop may be established in order to effectively control the operation of the communication end device.

The described power level may be measured by any power detector, which is located inside the receive path of the further receiver. Specifically, an appropriate power detector may be located or may be associated (a) with an amplifier such as for instance a so called Low Noise Amplifier and/or (b) with a receiving unit, which evaluates and/or which processes the received further radio signal(s). Depending on the used architecture of the further receiver with respect to the direction of the signal flow within the receive path of the further receiver the receiving unit may located before or after the described amplifier.

It is mentioned that the described amplifier or Low Noise Amplifier might be integrated within the receiving unit. This may mean that the (Low Noise) amplifier is a part of the receiving unit.

According to a further embodiment of the present invention the further receiver comprises a Satellite Positioning System receiver and in particular a Global Positioning System receiver. This may provide the advantage that the described concept for reducing self interference within a communication end device can be applied to a type of user equipment, which is widely-used by many users. Therefore, there may be a large benefit when implementing the described solution for efficiently reducing self interference effects within a communication end device.

Generally speaking, the described communication end device may improve the utilization of Satellite Positioning System (SPS) blanking in user equipment incorporating (a) a SPS receiver and (b) a cellular radio according to the second generation (2G) or third generation (3G) of Global Systems for Mobile Communication or according to Long Term Evolution (LTE) standards standard that might operate simultaneously.

It is mentioned that in case controlling the operation of the further receiver comprises a blanking the SPS blanking may typically be always a trade-off between (a) preventing self interference within the communication end device and (b) a reduction of the SPS reception intervals. This means that a SPS reception is not generally prioritized over the operation of the radio transceiver. The control unit of the described communication end device is rather capable of deciding whether it is beneficial to enable a disabling or blanking of the SPS receiver respectively the further receiver. Specifically, in case of a high bit rate of the (radio) transmitter (e.g. there is an almost permanent transmission activity) the control unit may decide that SPS blanking is not beneficial for the satellite reception as the reception time for the SPS signals would be too short. In this case GPS blanking may not be activated at all.

According to a further embodiment of the present invention the further receiver comprises a Near Field Communication receiver and in particular a Radio Frequency Identification receiver. This may provide the advantage that the described concept for reducing self interference within a communication end device can be applied with a technology, which is expected to be used more and more in daily life of communication end users.

At this point it is mentioned that the described concept of reducing self interference within a communication end device can be used in a beneficial manner for any type of receiver, which (a) exhibits a high sensitivity and which (b) is sensitive for burst mode transmitter signals, whereby the receiving information may be coded in particular by the use of large coded data blocks.

According to a further aspect of the present invention there is provided a method for controlling the operation of a communication end device. The communication end device may be in particular a communication end device as described above. The described method comprises (a) receiving radio signals from a transmitting network entity of a cellular telecommunication network by a receiver of a radio transceiver of the communication end device, (b) transmitting radio signals to a receiving network entity of the cellular telecommunication network by a transmitter of the radio transceiver, (c) receiving a further radio signal by a further receiver of the communication end device, (d) generating a control signal for controlling the operation of the further receiver by a control circuit, which is coupled to the radio transceiver and to the further receiver, wherein the control signal is generated based on (d1) a synchronization signal being related to a time dependent transmission scheme of the transmitter and on (d2) an information about the current operational state of the radio transceiver, and (e) controlling the operation of the further receiver in response to the generated control signal.

Also the described method is based on the idea that when controlling the operation of the further receiver based on both (i) a synchronization signal being related to a predefined time pattern of a time dependent transmission scheme of the transmitter and (ii) the current operational state of the radio transceiver a highly adaptive operational control of the further receiver can be realized. With this highly adaptive control it may be achieved that the reception of further radio signals is only prevented if a self interference between the transmitter and the further receiver is so strong that a reception and/or further processing of the received further signals would result at least with a high probability to a wrong signal reception and/or processing.

Due to the dependency of the described control signal from the time pattern of a time dependent transmission scheme of the transmitter the control signal may be exactly synchronized with the transmission burst timing of the transmitter of the radio transceiver. This may guarantee that the self interference within the communication end device is always kept within acceptable limits.

Further embodiments of the described method are also possible, which follow some of the above described embodiments of the communication end device, and/or are set forth in the appended claims.

According to a further aspect of the present invention there is provided a program element for controlling the operation of a communication end device. The program element, when being executed by a data processor, is adapted for controlling and/or for carrying out the above described method.

The program element may be implemented as computer readable instruction code in any suitable programming language, such as, for example, JAVA, C++, and may be stored on a computer-readable medium (removable disk, volatile or non-volatile memory, embedded memory/processor, etc.). The instruction code is operable to program a computer or any other programmable device to carry out the intended functions. The program element may be available from a network, such as the World Wide Web, from which it may be downloaded.

The invention may be realized by means of a computer program respectively software. However, the invention may also be realized by means of one or more specific electronic circuits respectively hardware. Furthermore, the invention may also be realized in a hybrid form, i.e. in a combination of software modules and hardware modules.

According to a further aspect of the present invention there is provided a computer-readable medium on which there is stored a computer program for controlling the operation of a communication end device. The computer program, when being executed by a data processor, is adapted for controlling and/or for carrying out the above described method.

The computer-readable medium may be readable by a computer or a processor. The computer-readable medium may be, for example but not limited to, an electric, magnetic, optical, infrared or semiconductor system, device or transmission medium. The computer-readable medium may include at least one of the following media: a computer-distributable medium, a program storage medium, a record medium, a computer-readable memory, a random access memory, an erasable programmable read-only memory, a computer-readable software distribution package, a computer-readable signal, a computer-readable telecommunications signal, computer-readable printed matter, and a computer-readable compressed software package.

It has to be noted that embodiments of the invention have been described with reference to different subject matters. In particular, some embodiments have been described with reference to apparatus type claims whereas other embodiments have been described with reference to method type claims. However, a person skilled in the art will gather from the above and the following description that, unless other notified, in addition to any combination of features belonging to one type of subject matter also any combination between features relating to different subject matters, in particular between features of the apparatus type claims and features of the method type claims is considered as to be disclosed with this document.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION OF THE INVENTION

Figure 1:
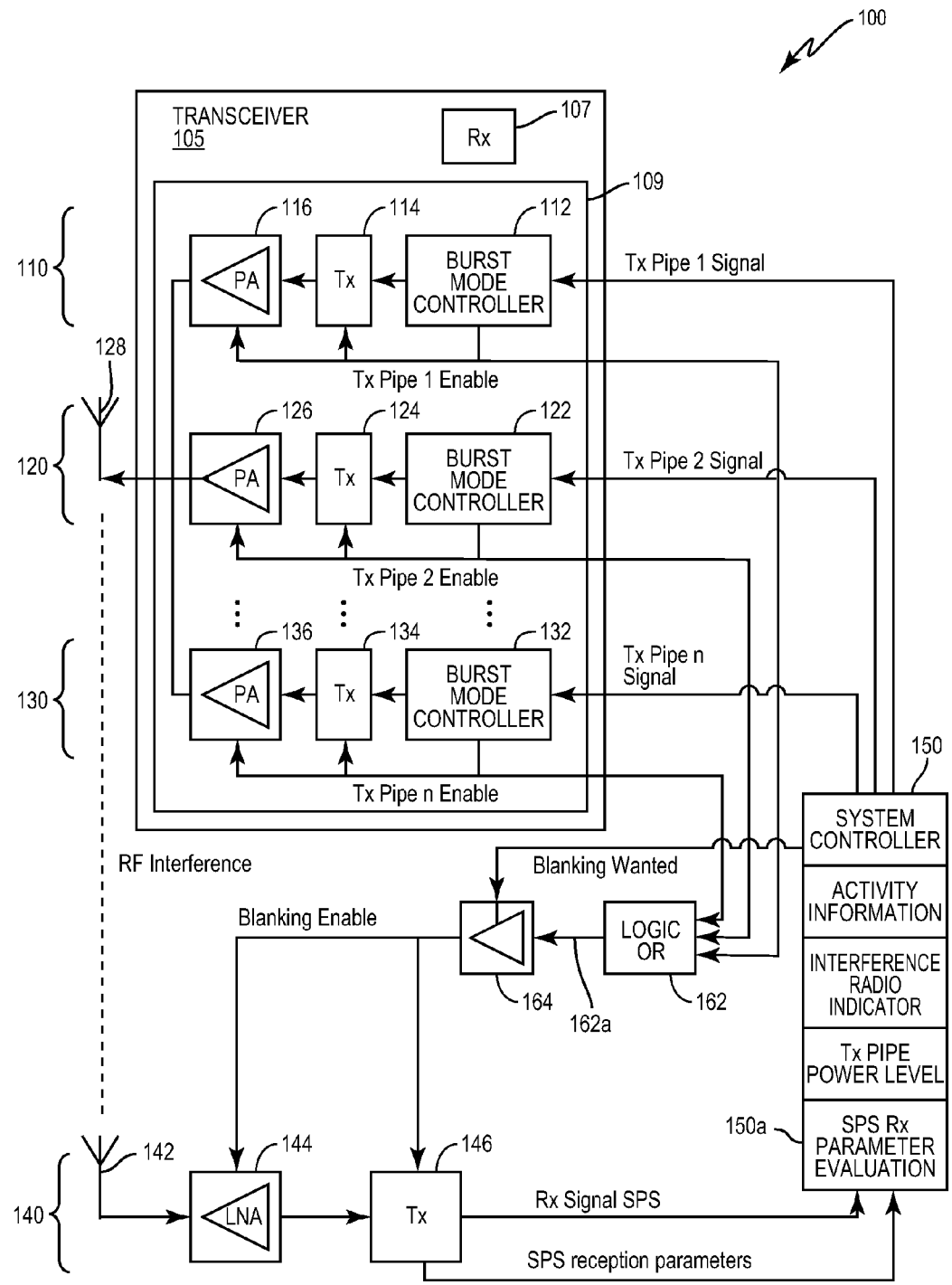
FIG. 1 shows a structural diagram of a communication end device in accordance with an embodiment of the invention, wherein the communication end device comprises transceiver with a plurality of cellular transmission pipes and a satellite positioning system (SPS) receiver.

The illustration in the drawing is schematically.

FIG. 1 shows a structural diagram of a communication end device 100 in accordance with an embodiment of the invention. The communication end device 100 is a multiband and multimode user equipment. Specifically, apart from a cellular radio transceiver 105 with a cellular transmitter 109 and a cellular receiver 107 the communication end device 100 comprises a further receiver 140. According to the embodiment described here, the further receiver 140 is a satellite positioning system (SPS) receiver 140.

The communication end device 100 comprises a control unit 150, which is connected both to the transmitter 109 of the cellular radio transceiver 105 and to the SPS receiver 140. The control unit is configured for controlling the operation of the cellular transmitter 109 and in particular of the SPS receiver 140.

As can be seen from FIG. 1, the cellular transmitter comprises a plurality of cellular transmission pipes. In FIG. 1 there are shown three transmission pipes, a first transmission pipe 110, a second transmission pipe 120 and a third transmission pipe 130. According to the embodiment described here each transmission pipe comprises a Burst Mode Controller, a transmitting unit and a power amplifier, which are connected in series between the control unit 150 and a transmit antenna 128 of the communication end device 100. As can be seen from FIG. 1, the first transmission pipe 110 comprises a Burst Mode Controller 112, a transmitting unit 114 and a power amplifier 116. Accordingly, the second transmission pipe 120 comprises a Burst Mode Controller 122, a transmitting unit 124 and a power amplifier 126 and the third transmission pipe 130 also comprises a Burst Mode Controller 132, a transmitting unit 134 and a power amplifier 136.

It is mentioned that the depicted Burst Mode Controllers 112, 122 and 132 may also be used for controlling a time dependent variation of a coding scheme being used by the transmission pipes 110, 120 and 130, respectively, and/or for controlling the operation of the transmission pipes 110, 120 and 130, respectively, on different carrier frequencies. Further, the Burst Mode Controllers 112, 122 and/or 132 may be a functional entity of and therefore integrated within the control unit 150.

The SPS receiver 140 of the communication end device 140 comprises a receive antenna 142, a Low Noise Amplifier (LNA) 144 and a receiving unit 146. As can be seen from FIG. 1, the receive unit 146 provides two signals to the control unit 150. A first signal is the wanted SPS signal, which is denominated "Rx Signal SPS" and which is fed to the control unit 150 for evaluating the first signal in a known manner. The second signal comprises parameters, which are indicative for the reception conditions of the SPS receiver 140. In FIG. 1 this second signal is denominated "SPS reception parameters". The second signal is fed to a subunit 150a of the control unit 150 for evaluation of the respective reception parameters of the SPS receiver 140.

The SPS receiver 140 and the cellular transmitter 110, 120, 130 are connected to each other via a Logical OR unit 162 and a switching unit 164. According to the embodiment described here the Logical OR unit 164 performs a logical OR operation with a plurality of "TX Pipe Enable" signals, which are respectively provided by the various Burst Mode Controller 112, 122 and 132. Therefore, the Logical OR unit 164 provides an output signal 162a, which is in a logical "ON" state, if at least one of the cellular transmission pipes 110, 120, 130 is currently transmitting a radio signal. This output signal 162a can be seen as a synchronization signal, which is related to a time pattern of a time dependent transmission scheme, e.g. a Time Division Multiple Access (TDMA) transmission scheme, which is used by the cellular transmitter 110, 120, 130.

As can be seen from FIG. 1 the output signal of the Logical OR unit 162 is fed to a switching unit 164. The switching unit provides an enable signal ("Blanking Enable") for the SPS receiver 140. Specifically, the enable signal is fed both to the receiving unit 146 and to LNA of the SPS receiver 140. If the enable signal is in a logical "ON" state, the operation of the SPS receiver 140 is disabled. In this document the temporarily disabling of the SPS receiver 140 is also denominated blanking.

However, apart from the condition that at present at least one of the cellular transmission pipes 110, 120, 130 is currently transmitting a radio signal, there is a further condition if a SPS receiver disabling is really accomplished. This further condition is related to the current operational state of the cellular transmitter 110, 120, 130. Therefore, the switching unit 164 is further fed with a control signal from the control unit 150, which indicates whether in view of the current operational state of the cellular transmitter 110, 120, 130 a disabling or a blanking of the SPS receiver 140 is wanted.

According to the embodiment described here the control unit 150 processes various operational state parameters in order to generate this control signal. Specifically, the generation of the control signal depends on (a) an activity information about the cellular transmitter 110, 120, 130, (b) an interference ratio indicator which indicates an amount of the time in which self interference is present or likely or the ratio of this time to the total length of a transmission time interval (TTI) or frame, (c) a selected transmission power of the cellular transmitter 110, 120, 130 and/or (d) reception parameters of the SPS receiver 140. The activity information may be indicative for instance for an idle mode, a call mode, a sleep mode etc. of the cellular transmitter 110, 120, 130. In the case of TDMA, the interference ratio indicator may e.g. be the number of active time slots within a time frame of the TDMA transmission scheme, which active time slots are currently used by the radio transceiver for transmitting the radio signals. In FIG. 1 the described control signal is denominated "Blanking Wanted". The determination whether interference is present or likely may be predetermined and/or depending on the nature of the time dependent transmission scheme. E.g. in the case of TDMA, it may be assumed that for any active time slot self interference is likely. If a certain coding scheme is employed, self interference may e.g. be regarded as likely for a predetermined number of higher order modulations.

Generally speaking, the operation of the SPS receiver 140 is controlled based on a combination between (a) a synchronization signal (i.e. the output signal of the Logical OR unit 162) being related to a time pattern of the time dependent transmission scheme, e.g. a TDMA transmission scheme, being used by the cellular transmitter 110, 120, 130 and (b) the current operational state of the cellular transmitter 110, 120, 130. Thus a highly adaptive operational control of the SPS receiver 140 can be realized. Thereby, it can be ensured that depending on the operational state of the cellular transmitter 110, 120, 130 a blanking of the SPS receiver 140 will only be performed if such a blanking is really necessary and will result in a benefit with respect to the SPS signal reception. Thereby, an unnecessary blanking of the SPS receiver 140 can be effectively avoided. Specifically, the blanking may only be accomplished if a strong self interference within the communication end device 100 has to be avoided, whereby the self interference is caused by an unwanted reception of cellular radio signals, which are transmitted by at least one of the transmitter pipes 110, 120 and 130, with the SPS receiver 140.

Figure 2:
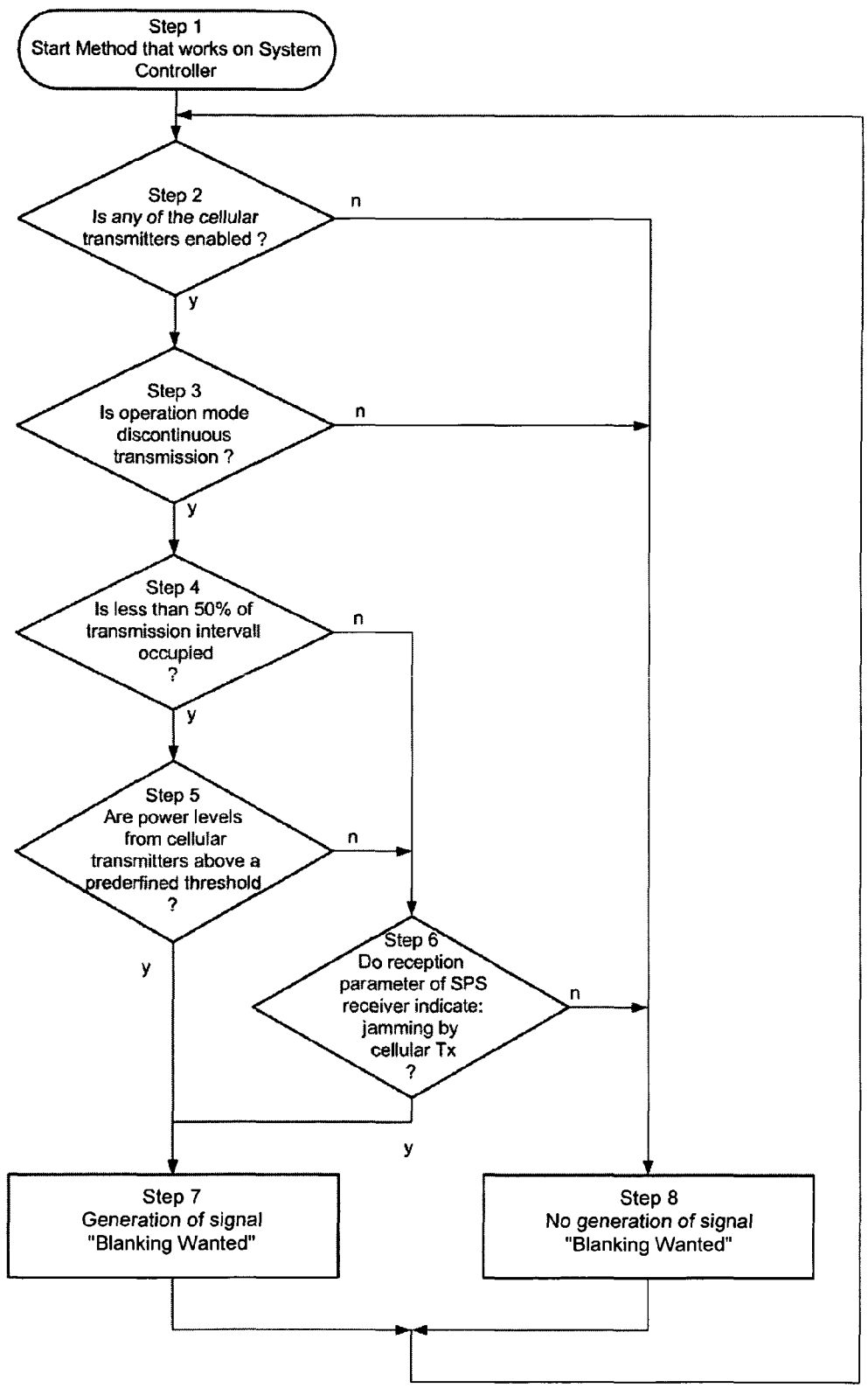
FIG. 2 shows a flowchart of a method for performing a decision to accomplish a blanking of the SPS receiver illustrated in FIG. 1.

FIG. 2 shows a flowchart of a method for performing a decision to accomplish a blanking of the SPS receiver. It is depicted how various operational state parameters of the communication end device 100 are logically combined in the control unit 150 in order to either (a) generate the control signal "Blanking Wanted", which is indicated in FIG. 1, or (b) not to generate this control signal "Blanking Wanted".

The described method, which may be carried out by a system controller of a communication end device, starts with a first step S1. In this respect it is mentioned that the system controller comprises all control equipment, which may be used for controlling the operation of the whole communication end device. According to the embodiment described here the system controller comprises inter alia the control unit 150, the Logical OR unit 162 and the switching unit 164.

In a second step S2 it is determined whether there is at least one cellular transmitter pipe active. If the answer is NO, the method continues with an eighth step S8, wherein the control unit 150 does not generate the signal "Blanking wanted" as depicted in FIG. 1. If the answer is YES, the method continues with a third step S3.

In step S3 it is determined whether the operational mode of the cellular transmitter 110, 120, 130 is discontinuous. If the answer is NO, the method is continued with the eighth step S8. If the answer is YES, the method is continued with a fourth step S4.

In step S4 it is determined whether there is less than a predetermined percentage of the transmission time interval or frame occupied by radio transmissions of at least one of the cellular transmitter pipes 110, 120, 130 that are likely to generate self interference, corresponding to the interference ratio indicator described with respect to FIG. 1. In the case of TDMA, this may be the percentage of active time slots. According to the embodiment described here this predetermined percentage is 50%. If the answer is NO, the method is continued with a sixth step S6, which will be described further below. If the answer is YES, the method is continued with a fifth step S5.

Generally the merit of step S4 is to have a threshold that decides that, if the percentage is lower than the predetermined percentage, it generally makes sense to blank as long as enough time remains for GPS reception. On the contrary, if the actual percentage is higher than the predetermined percentage, this may mean that the SPS receiver is blanked almost all the time. Therefore, it may be preferable not to blank the SPS receiver but allow the SPS receiver to continuously receive GPS data and accept the resulting self interference disadvantages.

In step S5 it is determined whether the power levels from the cellular transmitters are above a predefined threshold. If the answer is YES, the method is continued with a seventh step S7. If the answer is NO, the method is continued with the sixth step S6.

According to the embodiment described in FIG. 2 step S6 is only performed either (a) if the answer of the question of step 4 is NO or alternatively (b) if the answer of the question of step 4 is YES and the answer of the question of step 5 is NO. In this step S6 it is determined whether the reception parameters of the SPS receiver 140 indicate a jamming respectively a self interference caused by at least one of the cellular transmitter pipes 110, 120 and 130. If the answer is YES, the method is continued with the seventh step S7. If the answer is NO, the method is continued with step S8.

In step S7 the signal "Blanking wanted" (see FIG. 2) is generated by the control unit 150. As has already been described above, in step S8 the signal "Blanking wanted" is not generated. The described sequence of the flowchart is continuously operated. By performing the step S2 after the steps S7 and S8 and based on the respective decisions the signal "Blanking wanted" is generated in step S7 or alternatively in step S8 the signal "Blanking wanted" is not generated.

It is mentioned that according to the embodiment described here (a) step 2, (b) step 3 and (c) the combination of steps 4, 5 and 6 are combined with a logical AND. This means that the control signal "Blanking Wanted" (see FIG. 1) is only generated (a) if the question raised with step 2 is answered with YES, (b) if the question raised with step 2 is answered with YES and (c) if the battery of questions raised with the combination of the steps 4, 5 and 6 is answered with YES. Further, for answering the mentioned battery of questions with YES there are three different possibilities:

(i) Both the questions of step 4 and step 5 are answered with YES.

(ii) Question of step 4 is answered with YES, Question of step 5 is answered with NO and Question of step 6 is answered with YES.

(iii) Question of step 4 is answered with NO and Question of step 6 is answered with YES.

Generally speaking the combination of the steps 4, 5 and 6 can be seen as a combination between logical OR and AND functions.

It is pointed out that the described decisions being associated with the various steps 2, 3, 4, 5 and 6 could be combined with any arbitrary logical function such as an OR function and/or any combination between AND and OR function(s). Also a fuzzy logic and/or a linear combination of probabilities each being associated with the presence and/or a parameter value of an operational state of the cellular transmitter may be used in order to decide whether the control signal "Blanking Wanted" is generated. Although the described step 2 may be essential it may be possible that not all answers being associated with the various steps S2, S3, S4, S5 and S6 are taken into account whether the control signal "Blanking Wanted" has to be generated or not.

It should be noted that the term "comprising" does not exclude other elements or steps and "a" or "an" does not exclude a plurality. Also elements described in association with different embodiments may be combined. It should also be noted that reference signs in the claims should not be construed as limiting the scope of the claims.

LIST OF REFERENCE SIGNS

100 communication end device
110 first cellular transmitter pipe
112 Burst Mode Controller
114 transmitting unit
116 power amplifier
120 second cellular transmitter pipe
122 Burst Mode Controller
124 transmitting unit
126 power amplifier
128 antenna
130 third cellular transmitter pipe
132 Burst Mode Controller
134 transmitting unit
136 power amplifier
140 further receiver/Satellite Positioning System (SPS) receiver
142 antenna
144 Low Noise Amplifier (LNA)
146 receiving unit
150 control unit
150*a* subunit (SPS RX parameter evaluation)
162 Logical OR unit
162*a* output signal/synchronization signal
164 switching unit

The invention claimed is:

1. A communication end device comprising:
a radio transceiver comprising:
a first receiver configured to receive radio signals from a transmitting network entity of a cellular telecommunication network; and
a transmitter configured to transmit radio signals to a receiving network entity of the cellular telecommunication network;
a further second receiver configured to receive a further radio signal;
a control circuit coupled to the radio transceiver and to the second receiver and configured to generate a control signal for controlling the operation of the second receiver;
wherein the control signal is based on both:
a synchronization signal related to a time dependent transmission scheme of the transmitter; and
information about a current operational state of the radio transceiver;
wherein the information about the current operational state of the radio transceiver is generated by using a logical function;
wherein at least two operational state parameters of the radio transceiver are used as inputs for the logical function.

2. The communication end device of claim 1, wherein the control signal comprises an enable signal and/or a disable signal for the second receiver.

3. The communication end device of claim 1, wherein the time dependent transmission scheme of the transmitter is at least one of:
a Time Division Multiple Access transmission scheme;
a time varying coding scheme being used by the transmitter; and
a time varying usage of different carrier frequencies.

4. The communication end device of claim 3, wherein the information about the current operational state of the radio transceiver comprises information about a number or fraction of:
time slots, within a time frame or transmission time interval of the time dependent transmission scheme, in which the transmitter is active and/or expected to cause interference with the second receiver;
resource blocks, within the time frame or transmission time interval of the time dependent transmission scheme, in which the transmitter is active and/or expected to cause interference with the second receiver; or
coding blocks, within the time frame or transmission time interval of the time dependent transmission scheme, in which the transmitter is active and/or expected to cause interference with the second receiver.

5. The communication end device of claim 3:
wherein the time dependent transmission scheme of the transmitter is a Time Division Multiple Access transmission scheme;
wherein the information about the current operational state of the radio transceiver comprises information about a number of active time slots within a time frame of the Time Division Multiple Access transmission scheme which are currently used by the radio transceiver for transmitting the radio signals.

6. The communication end device of claim 1, wherein the information about the current operational state of the radio transceiver comprises information about a selected transmission power of the transmitter.

7. The communication end device of claim 1, wherein the information about the current operational state of the radio transceiver comprises activity information about the transmitter.

8. The communication end device of claim 1, wherein the control signal is generated further based on a reported receiver parameter of the second receiver.

9. The communication end device of claim 8, wherein the reported receiver parameter is indicative for a power level being received by the second receiver.

10. The communication end device of claim 1, wherein the second receiver comprises a Global Positioning System receiver.

11. The communication end device of claim 1, wherein the second receiver comprises a Radio Frequency Identification receiver.

12. A method for controlling the operation of a communication end device, the method comprising:
receiving radio signals from a transmitting network entity of a cellular telecommunication network by a first receiver of a radio transceiver of the communication end device;
transmitting radio signals to a receiving network entity of the cellular telecommunication network by a transmitter of the radio transceiver;
receiving a further radio signal by a further second receiver of the communication end device;
generating, by a control circuit, a control signal for controlling the operation of the second receiver; the control circuit coupled to the radio transceiver and to the second receiver; the generating the control signal comprising generating the control signal based on:
a synchronization signal related to a time dependent transmission scheme of the transmitter; and
information about the current operational state of the radio transceiver;
controlling the operation of the second receiver base on the generated control signal;
wherein the information about the current operational state of the radio transceiver is generated by using a logical function;
wherein at least two operational state parameters of the radio transceiver are used as inputs for the logical function.

13. The method of claim 12, wherein the control signal comprises an enable signal and/or a disable signal for the second receiver.

14. The method of claim 12, wherein the time dependent transmission scheme of the transmitter is at least one of:
a Time Division Multiple Access transmission scheme;
a time varying coding scheme being used by the transmitter; and
a time varying usage of different carrier frequencies.

15. The method of claim 14, wherein the information about the current operational state of the radio transceiver comprises information about a number or fraction of:
time slots, within a time frame or transmission time interval of the time dependent transmission scheme, in which the transmitter is active and/or expected to cause interference with the second receiver;
resource blocks, within the time frame or transmission time interval of the time dependent transmission scheme, in which the transmitter is active and/or expected to cause interference with the second receiver; or
coding blocks, within the time frame or transmission time interval of the time dependent transmission scheme, in which the transmitter is active and/or expected to cause interference with the second receiver.

16. The method of claim 14:
wherein the time dependent transmission scheme of the transmitter is a Time Division Multiple Access transmission scheme; and
the information about the current operational state of the radio transceiver comprises information about a number of active time slots within a time frame of the Time Division Multiple Access transmission scheme are currently used by the radio transceiver for transmitting the radio signals.

17. The method of claim 12, wherein the information about the current operational state of the radio transceiver comprises information about a selected transmission power of the transmitter.

18. The method of claim 12, wherein the information about the current operational state of the radio transceiver comprises activity information about the transmitter of the radio transceiver.

19. The method of claim 12, wherein the generating the control signal comprises generating the control signal further based on a reported receiver parameter of the second receiver.

20. The method as set forth in claim 19, wherein the reported receiver parameter is indicative for a power level being received by the second receiver.

21. A computer program product stored in a non-transitory computer readable medium for controlling the operation of a communication end device, the computer program product comprising software instructions which, when run on processor of the communication end device, causes the communication end device to:
receive radio signals from a transmitting network entity of a cellular telecommunication network by a first receiver of a radio transceiver of the communication end device;
transmit radio signals to a receiving network entity of the cellular telecommunication network by a transmitter of the radio transceiver;
receive a further radio signal by a further second receiver of the communication end device;
generate, by a control circuit, a control signal for controlling the operation of the second receiver; the control circuit coupled to the radio transceiver and to the second receiver; control signal generated based on:
a synchronization signal related to a time dependent transmission scheme of the transmitter; and
information about the current operational state of the radio transceiver;
control the operation of the second receiver base on the generated control signal;
generate the information about the current operational state of the radio transceiver by using a logical function, wherein at least two operational state parameters of the radio transceiver are used as inputs for the logical function.

* * * * *

UNITED STATES PATENT AND TRADEMARK OFFICE
CERTIFICATE OF CORRECTION

| | | |
|---|---|---|
| PATENT NO. | : 8,855,097 B2 | Page 1 of 1 |
| APPLICATION NO. | : 13/703539 | |
| DATED | : October 7, 2014 | |
| INVENTOR(S) | : Neumann | |

It is certified that error appears in the above-identified patent and that said Letters Patent is hereby corrected as shown below:

Drawings

In Fig. 2, Sheet 2 of 2, in Step "Step 4", in Line 3, delete "intervall" and insert -- interval --, therefor.

Specification

In Column 9, Line 58, delete "107" and insert -- 107, --, therefor.

In Column 10, Line 27, delete "140 comprises" and insert -- 100 comprises --, therefor.

In Column 10, Line 42, delete "unit 164" and insert -- unit 162 --, therefor.

In Column 10, Line 45, delete "unit 164" and insert -- unit 162 --, therefor.

Signed and Sealed this
Second Day of August, 2016

Michelle K. Lee
*Director of the United States Patent and Trademark Office*